US009720034B2

(12) United States Patent
Jung (10) Patent No.: US 9,720,034 B2
(45) Date of Patent: Aug. 1, 2017

(54) SEMICONDUCTOR TEST DEVICE AND METHOD OF OPERATING THE SAME

(71) Applicant: SAMSUNG ELECTRONICS CO., LTD., Suwon-si, Gyeonggi-do (KR)

(72) Inventor: Suk Hyun Jung, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 166 days.

(21) Appl. No.: 14/590,135

(22) Filed: Jan. 6, 2015

(65) Prior Publication Data
US 2015/0192638 A1    Jul. 9, 2015

(30) Foreign Application Priority Data
Jan. 7, 2014    (KR) .................. 10-2014-0002049

(51) Int. Cl.
*G01R 31/20*    (2006.01)
*G01R 31/28*    (2006.01)
*G06F 1/00*    (2006.01)
*G01R 1/00*    (2006.01)
*H04L 1/00*    (2006.01)

(52) U.S. Cl.
CPC ............ *G01R 31/2893* (2013.01); *G01R 1/00* (2013.01); *G06F 1/00* (2013.01); *H04L 1/00* (2013.01)

(58) Field of Classification Search
None
See application file for complete search history.

(56) References Cited

U.S. PATENT DOCUMENTS

| 6,097,201 | A | 8/2000 | Slocum | |
|---|---|---|---|---|
| 7,408,338 | B2 | 8/2008 | Ham et al. | |
| 7,838,790 | B2 | 11/2010 | Kang et al. | |
| 2007/0205753 | A1* | 9/2007 | Hau | G01R 3/00 324/756.02 |
| 2008/0042667 | A1* | 2/2008 | Yamashita | G01R 31/2865 324/750.03 |
| 2008/0301512 | A1* | 12/2008 | Saito | G06F 11/2733 714/736 |
| 2012/0146673 | A1 | 6/2012 | Kim et al. | |
| 2013/0141129 | A1* | 6/2013 | Lim | G01R 1/0466 324/750.25 |
| 2013/0168203 | A1* | 7/2013 | Nakajima | B65G 17/12 198/339.1 |

FOREIGN PATENT DOCUMENTS

| JP | 2006-126063 | 5/2006 |
|---|---|---|
| KR | 1020020064413 | 8/2002 |
| KR | 1020070106142 | 11/2007 |
| KR | 1020080031575 | 4/2008 |
| KR | 1020080044002 | 5/2008 |
| KR | 1020080100298 | 11/2008 |
| KR | 1020090029943 | 3/2009 |
| KR | 1020090030743 | 3/2009 |
| KR | 1020090044164 | 5/2009 |
| KR | 1020090054567 | 6/2009 |
| KR | 1020130099783 | 9/2013 |

* cited by examiner

*Primary Examiner* — Jermele M Hollington
*Assistant Examiner* — Temilade Rhodes-Vivour
(74) *Attorney, Agent, or Firm* — F. Chau & Associates, LLC (57) ABSTRACT

A method of operating a semiconductor test device includes transferring a first device under test (DUT) from a load tray to a first load shuttle. The first DUT is transferred from the first load shuttle to a first test board and a second DUT is transferred from the load tray to a second load shuttle.

19 Claims, 7 Drawing Sheets

SEMICONDUCTOR TEST DEVICE AND METHOD OF OPERATING THE SAME

CROSS-REFERENCE TO RELATED APPLICATION

This application claims priority under 35 U.S.C. §119 to Korean Patent Application No. 10-2014-0002049 filed on Jan. 7, 2014, the disclosure of which is incorporated by reference herein in its entirety.

TECHNICAL FIELD

Exemplary embodiments of the present inventive concept relate to a semiconductor test device, and a method of operating the same.

DISCUSSION OF RELATED ART

A semiconductor package test may use a tester including a computer equipped with devices at various layers and a handler that transfers a semiconductor package to connect the semiconductor package to the tester. The tester and the handler may be referred to as a semiconductor test device.

The semiconductor test device may perform a loading process, a test process, and an unloading process using a test tray that can hold a semiconductor package. With the development of advanced specifications for electronic products, highly integrated semiconductor packages with various functions may require long test times.

SUMMARY

Exemplary embodiments of the present inventive concept provide a semiconductor test device performing a parallel test without a waiting time by performing a test in a pipeline structure and a method of operating the same.

According to exemplary embodiments of the present inventive concept, a method of operating a semiconductor test device includes transferring a first device under test (DUT) from a load tray to a first load shuttle. The first DUT is transferred from the first load shuttle to a first test board and a second DUT is transferred from the load tray to a second load shuttle.

The second DUT may be transferred from the second load shuttle to a second test board and a third DUT may be transferred from the load tray to the first load shuttle while the first DUT transferred to the first test board is being tested.

The first test board and the second test board may be carried by a moveable belt.

The first DUT may be transferred from the first test board to a first unload shuttle while the second DUT transferred to the second test board is being tested.

The first DUT may be transferred from the first unload shuttle to an unload tray and the second DUT may be transferred from the second test board to a second unload shuttle.

The third DUT may be transferred from the first load shuttle to a third test board while the first DUT is being tested and the second DUT transferred to the second test board is being tested.

The first DUT may be transferred from the first unload shuttle to an unload tray in and the second DUT may be transferred from the second test board to a second unload shuttle while the third DUT is being tested.

A test on the first DUT and a test on the second DUT may start at different times.

Each of the first DUT and the second DUT may include at least one semiconductor package.

A non-transitory recording medium for recording a computer readable program may execute the above-described method.

According to exemplary embodiments of the present inventive concept, a semiconductor test device includes a load tray configured to load a first DUT, a second DUT, and a third DUT. A first transfer device is configured to transfer the first DUT from the load tray to a first load shuttle. A second transfer device is configured to transfer the first DUT from the first load shuttle to a first test board. A controller is configured to control the first transfer device and the second transfer device. While the second transfer device is transferring the first DUT from the first load shuttle to the first test board, the first transfer device transfers the second DUT from the load tray to a second load shuttle.

While the second transfer device is transferring the second DUT from the second load shuttle to a second test board, the first transfer device may transfer the third DUT from the load tray to the first load shuttle.

The semiconductor test device may include a third transfer device configured to transfer the first DUT from the first test board to a first unload shuttle and a fourth transfer device configured to transfer the first DUT from the first unload shuttle to an unload tray. While the fourth transfer device is transferring the first DUT from the first unload shuttle to the unload tray, the third transfer device may transfer the second DUT from the second test board to a second unload shuttle.

While the fourth transfer device is transferring the second DUT from the second unload shuttle to the unload tray, the third transfer device may transfer the third DUT from a third test board to the first unload shuttle.

A moveable belt may be configured to carry the first test board and the second test board.

BRIEF DESCRIPTION OF THE DRAWINGS

The above and other features of the inventive concept will become more apparent by describing in detail exemplary embodiments thereof, with reference to the accompanying drawings in which.

DETAILED DESCRIPTION OF THE EMBODIMENTS

Exemplary embodiments of the present inventive concept now will be described more fully hereinafter with reference to the accompanying drawings, in which exemplary embodiments are shown. The present inventive concept may, however, be embodied in many different forms and should not be construed as limited to the embodiments set forth herein. Like numbers may refer to like elements throughout the specification and drawings.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

Figure 1:
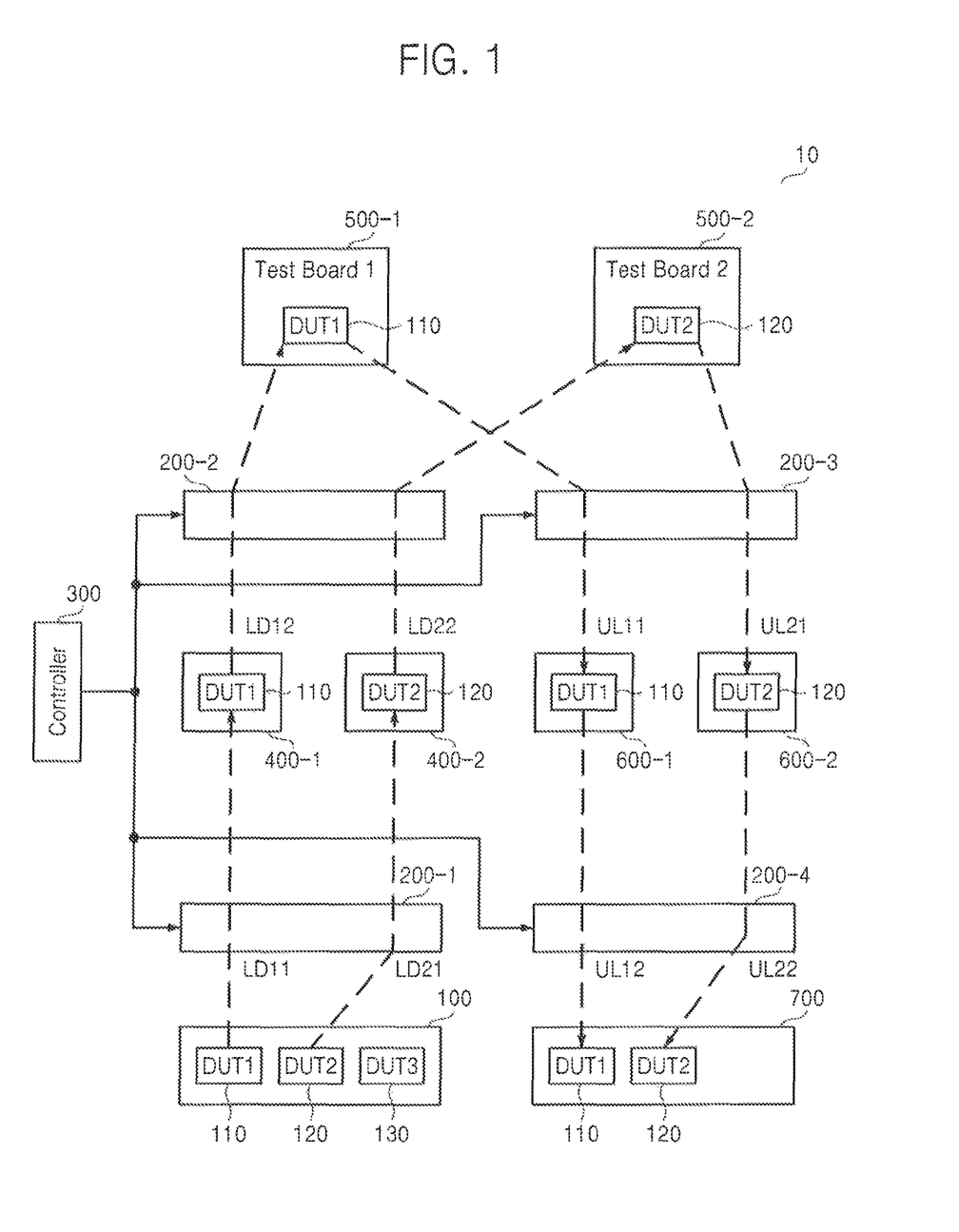
FIG. 1 is a diagram illustrating a method of testing a plurality of semiconductors in parallel using a semiconductor test device according to an exemplary embodiment of the present inventive concept.

FIG. 1 is a diagram illustrating a method of testing a plurality of semiconductors in parallel using a semiconductor test device 10 according to an exemplary embodiment of the present inventive concept. A procedure for processing a first device under test (DUT) 110 and a second DUT 120 in parallel is illustrated in FIG. 1.

The semiconductor test device 10 may include a load tray 100, a first transfer device 200-1, a second transfer device 200-2, a third transfer device 200-3, a fourth transfer device 200-4, a controller 300, a first load shuttle 400-1, a second load shuttle 400-2, a first test board 500-1, a second test board 500-2, a first unload shuttle 600-1, a second unload shuttle 600-2, and an unload tray 700.

The load tray 100 may load the first DUT 110, the second DUT 120, and a third DUT 130. Three DUTs 110, 120, and 130 are illustrated in FIG. 1, but the present inventive concept is not restricted to the embodiment illustrated in FIG. 1. For example, more than three DUTs may be loaded to the semiconductor test device 10. Each of the DUTs 110, 120, and 130 may include at least one semiconductor device to be tested and the semiconductor device may be a semiconductor chip or a semiconductor package.

The first through fourth transfer devices 200-1 through 200-4 may include a robot having a plurality of hands for transferring the semiconductor device. The first transfer device 200-1 may transfer the first DUT 110 loaded onto the load tray 100 to the first load shuttle 400-1 (operation LD11).

The second transfer device 200-2 may transfer the first DUT 110 from the first load shuttle 400-1 to the first test board 500-1 (operation LD12) and simultaneously (or in parallel) the first transfer device 200-1 may transfer the second DUT 120 loaded onto the load tray 100 to the second load shuttle 400-2 (operation LD21). The phrase "operations are performed simultaneously" may mean that the operations are performed at the same time or that the operations are performed in parallel within a predetermined range of time.

The first test board 500-1 may perform a first test on the first DUT 110. While the first test board 500-1 is testing the first DUT 110, the second transfer device 200-2 may transfer the second DUT 120 from the second load shuttle 400-2 to the second test board 500-2 (LD22). The second test board 500-2 may perform a second test on the second DUT 120.

The first test on the first DUT 110 loaded onto the first test board 500-1 and the second test on the second DUT 120 loaded onto the second test board 500-2 may start at different times. The first and second test boards 500-1 and 500-2 may perform the tests simultaneously or in parallel during a predetermined period of time. Two test boards 500-1 and 500-2 are illustrated in FIG. 1, but the present inventive concept is not restricted to the embodiment illustrated in FIG. 1.

The first test board 500-1 and the second test board 500-2 may be carried by a moving belt or a conveyor belt. The length of the moving belt or the conveyor belt and the distance between the test boards 500-1 and 500-2 may be determined by taking a time taken to test a semiconductor device into account. The structure and operation of the moving belt will be described in more detail below with reference to FIG. 4. When the first test on the first DUT 110 is terminated, the third transfer device 200-3 may transfer the first DUT 110 from the first test board 500-1 to the first unload shuttle 600-1 (UL11).

The fourth transfer device 200-4 may transfer the first DUT 110 from the first unload shuttle 600-1 to the unload tray 700 (operation UL12) and simultaneously the third transfer device 200-3 may transfer the second DUT 120 on which the test has been terminated from the second test board 500-2 to the second unload shuttle 600-2 (operation UL21).

The fourth transfer device 200-4 may transfer the second DUT 120 from the second unload shuttle 600-2 to the unload tray 700 (operation UL22). The controller 300 may control the first transfer device 200-1, the second transfer device 200-2, the third transfer device 200-3, and the fourth transfer device 200-4.

Figure 2:
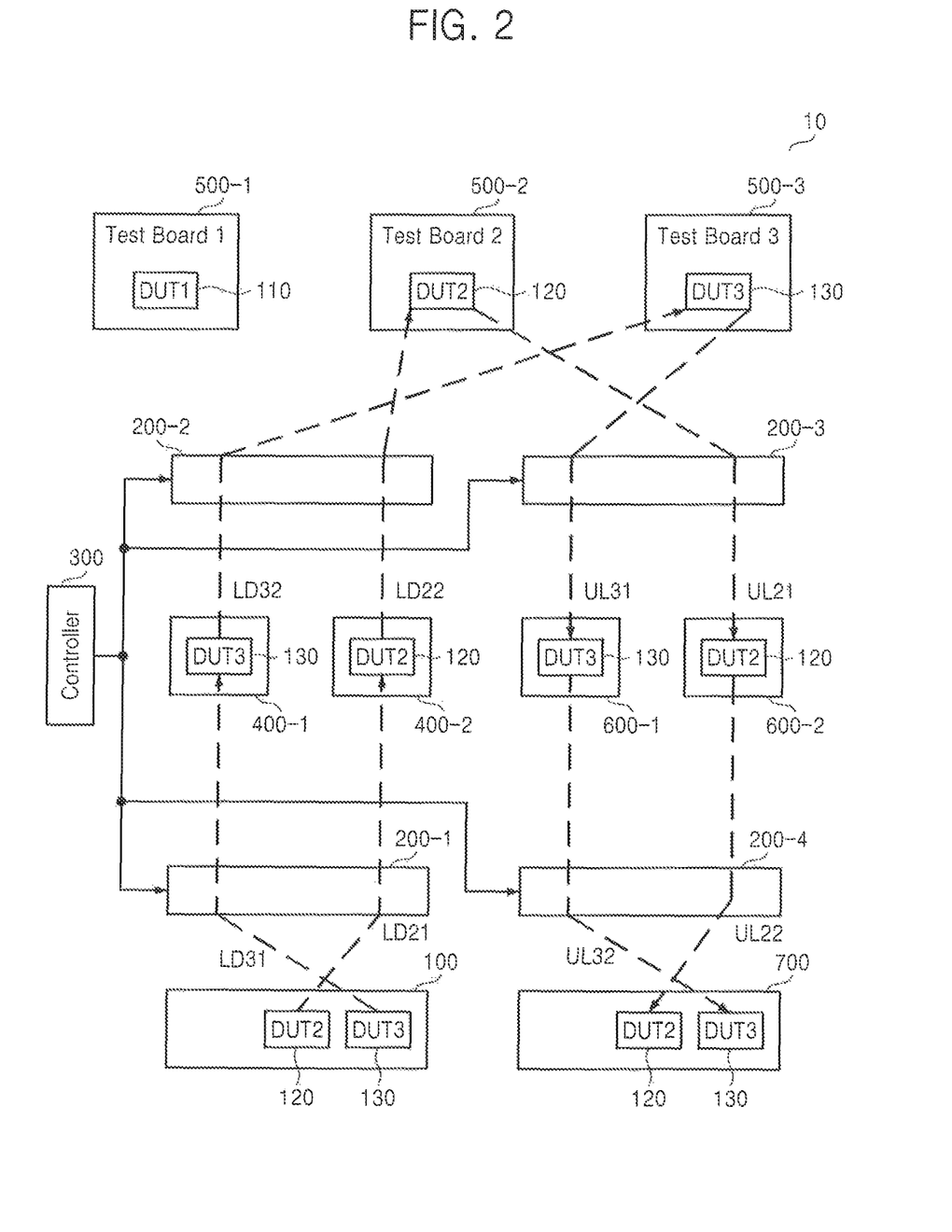
FIG. 2 is a diagram illustrating a method of testing a plurality of semiconductors in parallel using a semiconductor test device according to an exemplary embodiment of the present inventive concept.

FIG. 2 is a diagram illustrating a method of testing a plurality of semiconductors in parallel using a semiconductor test device 10 according to an exemplary embodiment of the present inventive concept. A procedure for processing the second DUT 120 and the third DUT 130 in parallel is illustrated in FIG. 2.

The first transfer device 200-1 may transfer the second DUT 120 loaded onto the load tray 100 to the second load shuttle 400-2 (operation LD21).

The second transfer device 200-2 may transfer the second DUT 120 from the second load shuttle 400-2 to the second test board 500-2 (operation LD22) and simultaneously (or in parallel) the first transfer device 200-1 may transfer the third DUT 130 loaded onto the load tray 100 to the first load shuttle 400-1 (operation LD31). The second test board 500-2 may perform the second test on the second DUT 120. While the second test board 500-2 is testing the second DUT 120, the second transfer device 200-2 may transfer the third DUT 130 from the first load shuttle 400-1 to a third test board 500-3 (operation LD32).

The third test board 500-3 may perform a third test on the third DUT 130. The second test on the second DUT 120 loaded onto the second test board 500-2 and the third test on the third DUT 130 loaded onto the third test board 500-3 may start at different times.

The tests on the DUTs 110, 120, and 130 respectively loaded onto the test boards 500-1, 500-2, and 500-3 may be performed in parallel during a predetermined period of time. When the second test on the second DUT 120 is terminated, the third transfer device 200-3 may transfer the second DUT 120 from the second test board 500-2 to the second unload shuttle 600-2 (operation UL21).

The fourth transfer device 200-4 may transfer the second DUT 120 from the second unload shuttle 600-2 to the unload tray 700 (operation UL22) and simultaneously the third transfer device 200-3 may transfer the third DUT 130 on which the third test has been terminated from the third test board 500-3 to the first unload shuttle 600-1 (UL31). The fourth transfer device 200-4 may transfer the third DUT 130 from the first unload shuttle 600-1 to the unload tray 700 (operation UL32).

Figure 3:
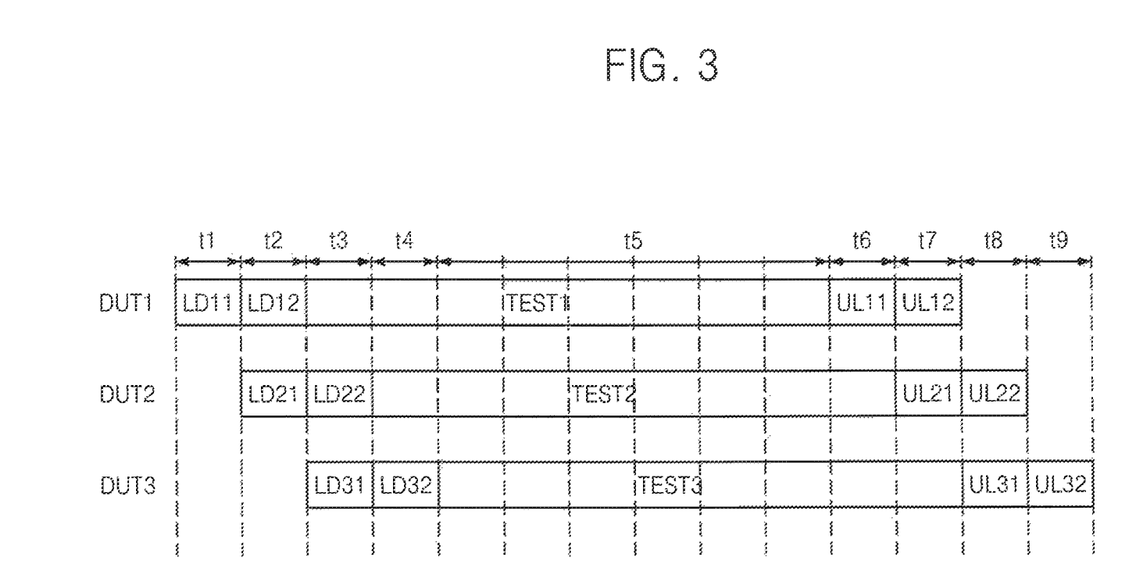
FIG. 3 is a timing chart showing exemplary operations of the method illustrated in FIG. 1 or FIG. 2.

FIG. 3 is a timing chart showing exemplary operations of the method illustrated in FIG. 1 or FIG. 2. A procedure for processing the DUTs 110, 120, and 130 using a pipeline method or in parallel will be described in more detail below with reference to FIGS. 1 through 3.

During a first period t1, the first DUT 110 may be transferred from the load tray 100 to the first load shuttle 400-1 (operation LD11). During a second period t2, the first DUT 110 may be transferred from the first load shuttle 400-1 to the first test board 500-1 (operation LD12) and simultaneously (or in parallel) the second DUT 120 may be transferred from the load tray 100 to the second load shuttle 400-2 (operation LD21).

During a third period t3, the first test board 500-1 may perform the first test on the first DUT 110 (e.g., operation TEST1), the second DUT 120 may be transferred from the second load shuttle 400-2 to the second test board 500-2 (operation LD22), and the third DUT 130 may be transferred from the load tray 100 to the first load shuttle 400-1 (LD31). During a fourth period t4, the first test board 500-1 may perform the first test on the first DUT 110 (operation TEST1), the second test board 500-2 may perform the second test on the second DUT 120 (e.g., operation TEST2), and the third DUT 130 may be transferred from the first load shuttle 400-1 to the third test board 500-3 (operation LD32).

During a fifth period t5, tests on the respective DUTs 110, 120, and 130 may be performed in parallel in the test boards 500-1, 500-2, and 500-3, respectively. During a sixth period t6, the first DUT 110 on which the first test has been completed may be transferred from the first test board 500-1 to the first unload shuttle 600-1 (operation UL11), the second DUT 120 may be tested by the second test board 500-2 (e.g., TEST2), and the third DUT 130 may be tested by the third test board 500-3 (e.g., TEST3).

During a seventh period t7, the first DUT 110 may be transferred from the first unload shuttle 600-1 to the unload tray 700 (operation UL12), the second DUT 120 on which the second test has been completed may be transferred from the second test board 500-2 to the second unload shuttle 600-2 (operation UL21), and the third DUT 130 may be tested by the third test board 500-3 (e.g., TEST3).

During an eighth period t8, the second DUT 120 may be transferred from the second unload shuttle 600-2 to the unload tray 700 (operation UL22) and the third DUT 130 on which the third test has been completed may be transferred from the third test board 500-3 to the first unload shuttle 600-1 (operation UL31).

During a ninth period t9, the third DUT 130 may be transferred from the first unload shuttle 600-1 to the unload tray 700 (operation UL32). The DUTs 110, 120, and 130 may be transferred and/or tested by the test boards 500-1, 500-2, and 500-3, respectively, in parallel using a pipeline method or a time division method, and a semiconductor device, for example the DUTs 110, 120, and/or 130 can be tested without a waiting time. As a result, the capacity of the semiconductor test device 10 may be increased.

Figure 4:
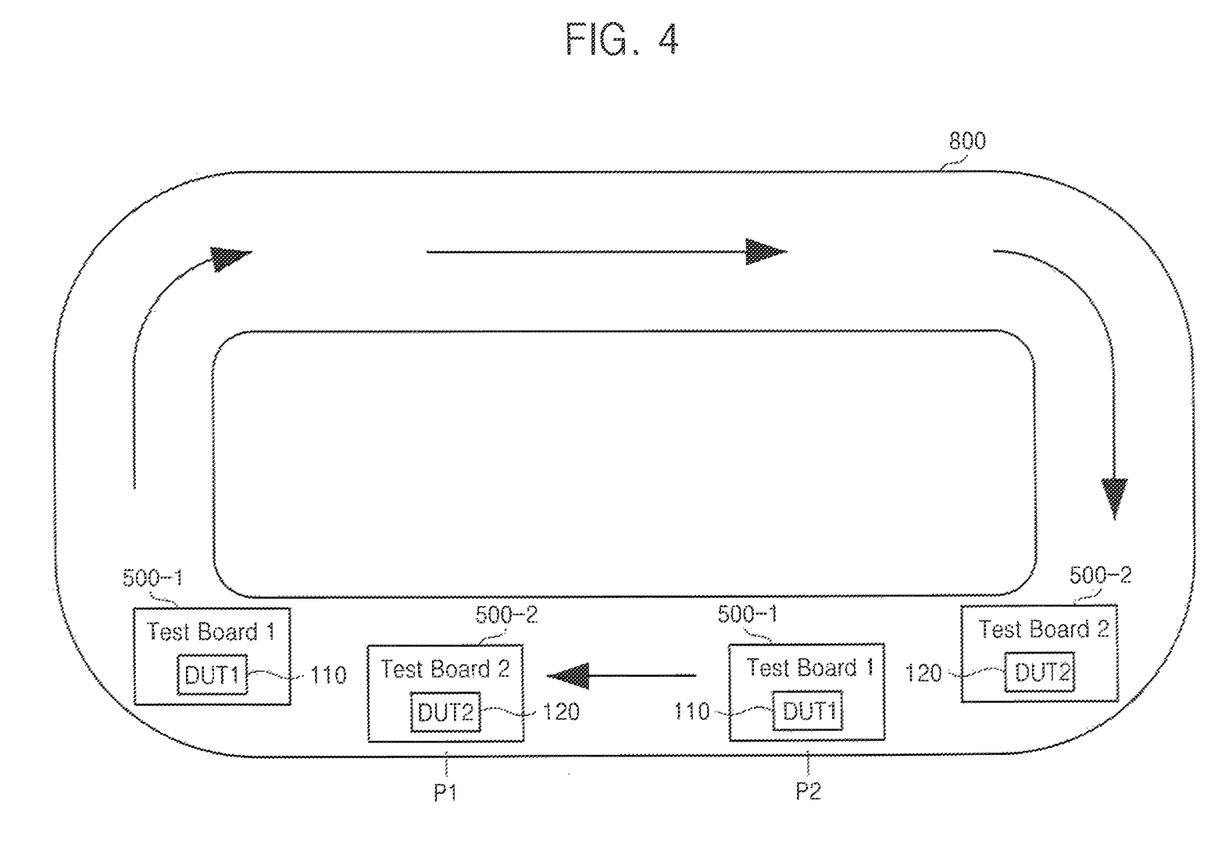
FIG. 4 is a diagram illustrating a procedure for transferring test boards using a moving belt according to an exemplary embodiment of the present inventive concept.

FIG. 4 is a diagram illustrating a procedure for transferring the test boards 500-1 and 500-2 using a moving belt 800 according to an exemplary embodiment of the present inventive concept. Referring to FIGS. 1 through 4, the first test board 500-1 and the second test board 500-2 may be carried by a moving belt 800 (e.g., a conveyor belt).

Each of the DUTs 110 and 120 may be transferred from the first or second load shuttles 400-1 or 400-2 to the test boards 500-1 or 500-2 by the second transfer device 200-2 at a first point P1. The third transfer device 200-3 may unload each of the DUTs 110 and 120 on which the test has been completed from the test boards 500-1 or 500-2 onto the unload shuttles 600-1 or 600-2 at a second point P2. The DUTs 110 and 120 respectively loaded on the test boards 500-1 and 500-2 may be tested while the moving belt 800 is running or moving.

Figure 5:
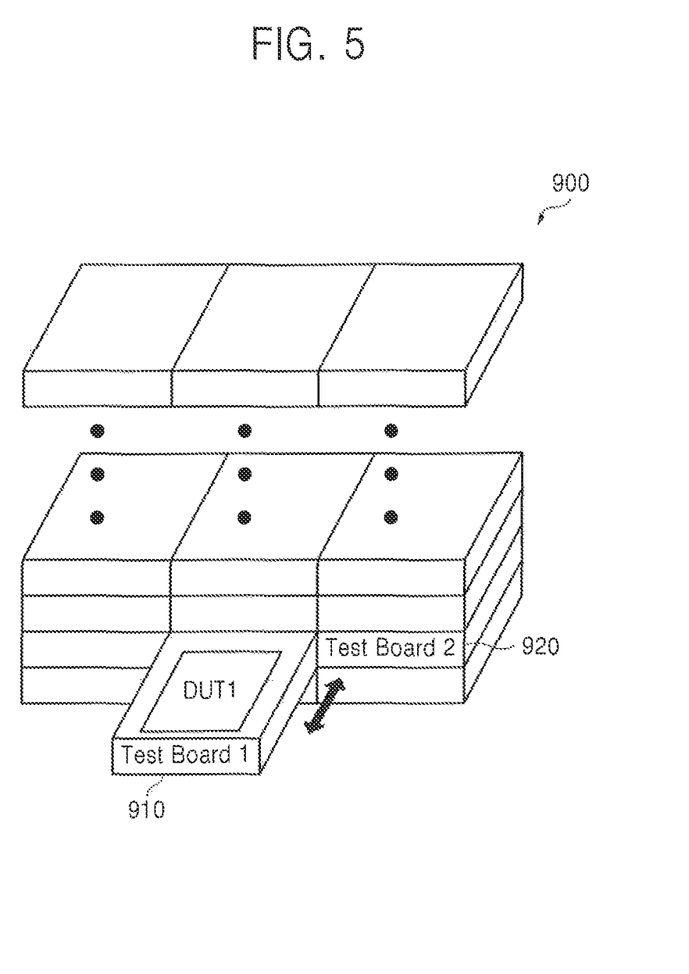
FIG. 5 is a diagram of a three dimensional test board array according to an exemplary embodiment of the present inventive concept.

FIG. 5 is a diagram of a three dimensional test board array 900 according to an exemplary embodiment of the present inventive concept. Referring to FIGS. 1 through 3 and FIG. 5, the test board array 900 may include a plurality of test boards 910 and 920. The test board array 900 may be disposed in a drawer and each of the test boards 910 and 920 may test a DUT. The test board array 900 can minimize an increase in space that may occur when the number of test boards increases. When the number of test boards included in the test board array 900 is reduced, a waiting time can be reduced.

Figure 6:
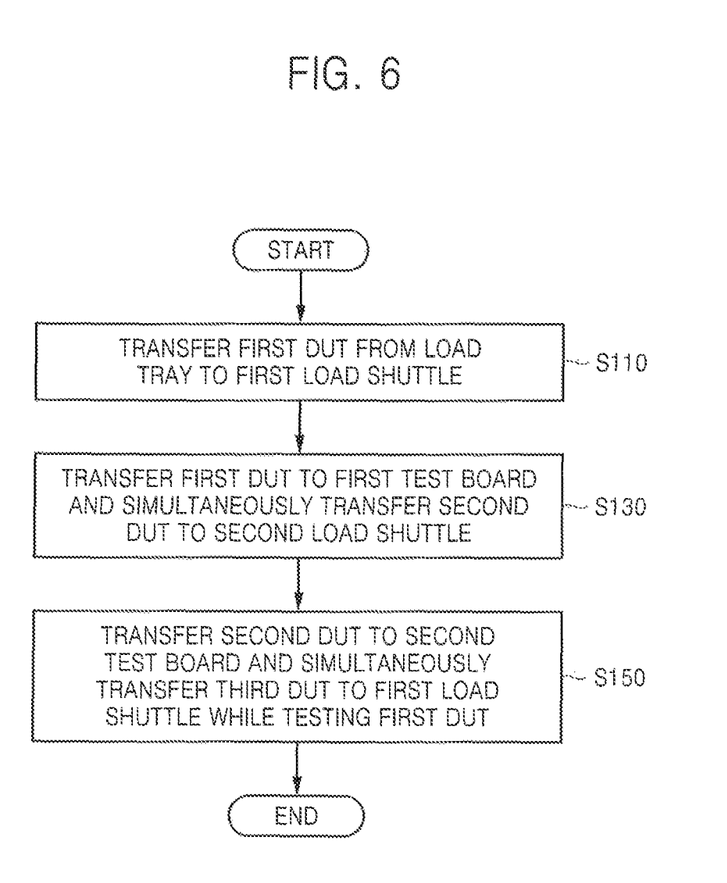
FIG. 6 is a flowchart of a method of operating the semiconductor test device illustrated in FIGS. 1 and 2 according to an exemplary embodiment of the present inventive concept.

FIG. 6 is a flowchart of a method of operating the semiconductor test device 10 illustrated in FIGS. 1 and 2 according to an exemplary embodiment of the present inventive concept. Referring to FIGS. 1 through 6, the first transfer device 200-1 may transfer the first DUT 110 from the load tray 100 to the first load shuttle 400-1 in step S110.

The second transfer device 200-2 may transfer the first DUT 110 from the first load shuttle 400-1 to the first test board 500-1 and simultaneously (or in parallel) the first transfer device 200-1 may transfer the second DUT 120 from the load tray 100 to the second load shuttle 400-2 in step S130. While the first DUT 110 is being tested by the first test board 500-1, the second transfer device 200-2 may transfer the second DUT 120 to the second test board 500-2 and the first transfer device 200-1 may transfer the third DUT 130 to the first load shuttle 400-1 in step S150.

Figure 7:
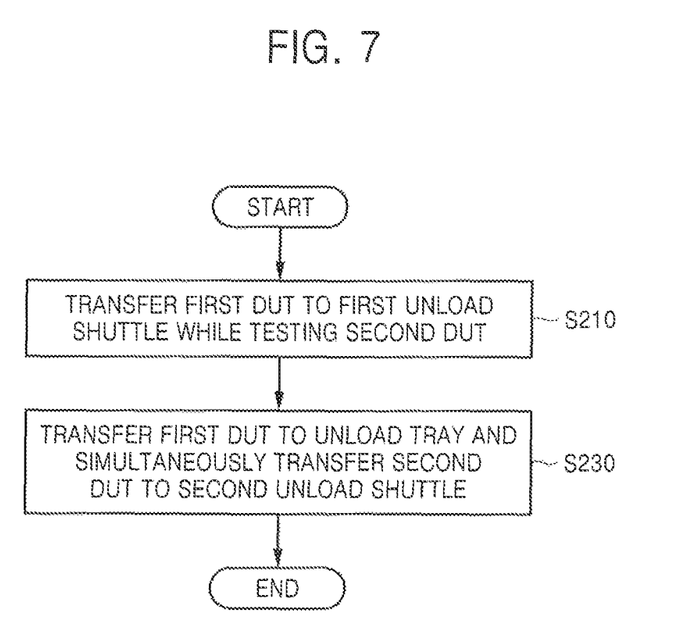
FIG. 7 is a flowchart of a method of operating the semiconductor test device illustrated in FIGS. 1 and 2 according to an exemplary embodiment of the present inventive concept.

FIG. 7 is a flowchart of a method of operating the semiconductor test device 10 illustrated in FIGS. 1 and 2 according to exemplary embodiments of the present inventive concept. Referring to FIGS. 1 through 5 and FIG. 7, while the second DUT 120 is being tested by the second test board 500-2, the first DUT 110 may be transferred to the first unload shuttle 600-1 in step S210.

The fourth transfer device 200-4 may transfer the first DUT 110 from the first unload shuttle 600-1 to the unload tray 700 and the third transfer device 200-3 may transfer the second DUT 120 from the second test board 500-2 to the second unload shuttle 600-2 in step S230.

A computer readable program for executing a method of operating a semiconductor test device according to an exemplary embodiment of the present inventive concept may be stored in a recording medium. For example, the computer readable program may be stored in the controller 300 shown in FIGS. 1 and 2.

As described above, the semiconductor test device according to an exemplary embodiment of the present inventive concept may test a plurality of semiconductor devices in parallel using a plurality of test boards in a pipeline method, reducing a waiting time for the test. When the semiconductor test device tests the plurality of semiconductor devices in parallel, it can test many semiconductor devices in a relatively short time.

While the inventive concept has been particularly shown and described with reference to exemplary embodiments thereof, it will be understood by those of ordinary skill in the art that various changes in form and detail may be made therein without departing from the spirit and scope of the present inventive concept as defined by the following claims.

What is claimed is:

1. A method of operating a semiconductor test device, the method comprising:
   transferring a first device under test (DUT) from a load tray to a first load shuttle; and
   transferring the first DUT from the first load shuttle to a first test board and transferring a second DUT from the load tray to a second load shuttle, wherein the first DUT is transferred from the first load shuttle to the first test board at substantially a same time that the second DUT is transferred from the load tray to the second load shuttle, and wherein the first load shuttle and the second load shuttle are configured to move independently from each other.

2. The method of claim 1, further comprising transferring the second DUT from the second load shuttle to a second test board and transferring a third DUT from the load tray to the first load shuttle while the first DUT transferred to the first test board is being tested.

3. The method of claim 2, wherein the first test board and the second test board are carried by a moveable belt.

4. The method of claim 2, further comprising transferring the first DUT from the first test board to a first unload shuttle while the second DUT transferred to the second test board is being tested.

5. The method of claim 4, further comprising transferring the first DUT from the first unload shuttle to an unload tray and transferring the second DUT from the second test board to a second unload shuttle.

6. The method of claim 2, further comprising transferring the third DUT from the first load shuttle to a third test board while the first DUT is being tested and the second DUT transferred to the second test board is being tested.

7. The method of claim 6, further comprising transferring the first DUT from the first unload shuttle to an unload tray and transferring the second DUT from the second test board to a second unload shuttle while the third DUT is being tested.

8. The method of claim 2, wherein a test on the first DUT and a test on the second DUT start at different times.

9. The method of claim 2, wherein each of the first DUT and the second DUT includes at least one semiconductor package.

10. A non-transitory recording medium for recording a computer readable program for executing the method of claim 1.

11. A semiconductor test device, comprising:
    a load tray configured to load a first device under test (DUT), a second DUT, and a third DUT;
    a first transfer device configured to transfer the first DUT from the load tray to a first load shuttle;
    a second transfer device configured to transfer the first DUT from the first load shuttle to a first test board;
    a controller configured to control the first transfer device and the second transfer device,
    wherein while the second transfer device is transferring the first DUT from the first load shuttle to the first test board, the first transfer device transfers the second DUT from the load tray to a second load shuttle; and
    a third transfer device configured to transfer the first DUT from the first test board to a first unload shuttle; and
    a fourth transfer device configured to transfer the first DUT from the first unload shuttle to an unload tray,
    wherein while the fourth transfer device is transferring the first DUT from the first unload shuttle to the unload tray, the third transfer device transfers the second DUT from a second test board to a second unload shuttle, and
    wherein each of the first load shuttle, the second load shuttle, the first unload shuttle and the second unload shuttle are configured to move independently from each other.

12. The semiconductor test device of claim 11, wherein while the second transfer device is transferring the second DUT from the second load shuttle to a second test board, the first transfer device transfers the third DUT from the load tray to the first load shuttle.

13. The semiconductor test device of claim 11, wherein while the fourth transfer device is transferring the second DUT from the second unload shuttle to the unload tray, the third transfer device transfers the third DUT from a third test board to the first unload shuttle.

14. The semiconductor test device of claim 11, further comprising a moveable belt configured to carry the first test board and the second test board.

15. A semiconductor test device, comprising:
    a load tray; and
    a first transfer device, a second transfer device, and a third transfer device,
    wherein the first transfer device is configured to transfer a first semiconductor device from the load tray to a first load shuttle,
    wherein the second transfer device is configured to transfer the first semiconductor device from the first load shuttle to a first test board and the first transfer device is configured to transfer a second semiconductor device from the load tray to a second load shuttle, and
    wherein the second transfer device is configured to transfer the second semiconductor device from the second load shuttle to a second test board and the first transfer device is configured to transfer a third semiconductor device from the load tray to the first load shuttle, wherein the first load shuttle and the second load shuttle are configured to move independently from each other.

16. The semiconductor test device of claim 15, wherein the second transfer device is configured to transfer the third semiconductor device to a third test board.

17. The semiconductor test device of claim 15, wherein the second transfer device is configured to transfer the third semiconductor device to a third test board, and wherein the semiconductor test device is configured to test the first, second and third semiconductor devices.

18. The semiconductor test device of claim 15, wherein the third transfer device is configured to transfer the first and third semiconductor devices from the first test board to a first unload shuttle, and wherein a fourth transfer device is configured to transfer the first and third semiconductor devices from the first unload shuttle to an unload tray, and wherein the first unload shuttle is configured to move independently from each of the first and second load shuttles.

19. The semiconductor test device of claim 15, wherein the first and second transfer devices are connected to a controller configured to control the first and second transfer devices.

* * * * *